US012640208B2

(12) United States Patent
Fornara

(10) Patent No.: US 12,640,208 B2
(45) Date of Patent: May 26, 2026

(54) METHOD FOR CORRUPTING DATA STORED IN A MEMORY, AND CORRESPONDING INTEGRATED CIRCUIT

(71) Applicant: STMicroelectronics International N.V., Geneva (CH)

(72) Inventor: Pascal Fornara, Pourrieres (FR)

(73) Assignee: STMicroelectronics International N.V., Geneva (CH)

( * ) Notice: Subject to any disclaimer, the term of this patent is extended or adjusted under 35 U.S.C. 154(b) by 92 days.

(21) Appl. No.: 18/635,767

(22) Filed: Apr. 15, 2024

(65) Prior Publication Data

US 2025/0292840 A1 Sep. 18, 2025

(30) Foreign Application Priority Data

Apr. 20, 2023 (FR) ...................................... 2303965

(51) Int. Cl.
*G11C 16/22* (2006.01)
*G11C 16/30* (2006.01)
(Continued)

(52) U.S. Cl.
CPC .............. *G11C 16/22* (2013.01); *G11C 16/30* (2013.01); *H10B 41/30* (2023.02); *H10D 30/0411* (2025.01); *H10D 30/689* (2025.01)

(58) Field of Classification Search
CPC ........ G11C 16/22; G11C 16/30; H10B 41/30; H10D 30/0411; H10D 30/689
(Continued)

(56) References Cited

U.S. PATENT DOCUMENTS

| | | | | | |
|---|---|---|---|---|---|
| 5,909,397 | A | * | 6/1999 | San ..................... | G11C 16/3445 |
| | | | | | 365/185.24 |
| 7,773,423 | B1 | * | 8/2010 | Bu ..................... | G11C 16/0416 |
| | | | | | 365/185.24 |

(Continued)

FOREIGN PATENT DOCUMENTS

| | | | | | |
|---|---|---|---|---|---|
| CN | 101611413 | A | * | 12/2009 | ............. H10B 69/00 |
| EP | 3770789 | A1 | * | 1/2021 | .......... H10D 30/683 |
| EP | 3770789 | B1 | | 1/2022 | |

OTHER PUBLICATIONS

INPI Search Report and Written Opinion for priority application, FR Appl. No. 2303965, report dated Dec. 1, 2023, 10 pgs.

*Primary Examiner* — Michael T Tran
(74) *Attorney, Agent, or Firm* — Crowe & Dunlevy LLC

(57) ABSTRACT

An integrated circuit includes a memory-cell configured to store a piece of data. The memory cell includes a state transistor having a floating gate configured to store a charge representative of the piece of data and a control gate. A capacitive structure includes a first electrically-conductive body coupled to the floating gate, a second electrically-conductive body and a dielectric body between the first and second electrically-conductive bodies. A generation circuit is configured to detect an invasive or non-invasive attack and generate in response thereto a voltage applied to the second electrically-conductive body to generate a leakage current between the first and second electrically-conductive bodies through the dielectric body. The leakage current is applied to the floating gate in order to modify the charge at the floating gate and corrupt the stored piece of data.

17 Claims, 3 Drawing Sheets

(51) Int. Cl.
    H10B 41/30     (2023.01)
    H10D 30/01     (2025.01)
    H10D 30/68     (2025.01)

(58) Field of Classification Search
    USPC ....................................... 365/185.04, 185.24
    See application file for complete search history.

(56)           References Cited

U.S. PATENT DOCUMENTS

| | | | |
|---|---|---|---|
| 2002/0126531 A1* | 9/2002 | Hosono | G11C 16/26 365/185.17 |
| 2006/0088987 A1* | 4/2006 | Yeo | H10B 69/00 257/E27.103 |
| 2009/0066866 A1* | 3/2009 | Takama | G02F 1/13338 349/33 |
| 2012/0260023 A1* | 10/2012 | Nagai | G06F 3/0679 711/E12.008 |
| 2016/0225725 A1 | 8/2016 | Kim et al. | |
| 2020/0035624 A1 | 1/2020 | Marinet et al. | |

* cited by examiner

METHOD FOR CORRUPTING DATA STORED IN A MEMORY, AND CORRESPONDING INTEGRATED CIRCUIT

PRIORITY CLAIM

This application claims the priority benefit of French Application for Patent No. 2303965, filed on Apr. 20, 2023, the content of which is hereby incorporated by reference in its entirety to the maximum extent allowable by law.

TECHNICAL FIELD

Implementations and embodiments relate to the protection of data stored in an integrated circuit memory in response to invasive or non-invasive attacks.

BACKGROUND

The memory, in particular a non-volatile memory, of an integrated circuit might be exposed to invasive or non-invasive hardware attacks intended to recover the data contained therein.

So-called "invasive" hardware attacks relate to reverse-engineering techniques allowing rebuilding the hardware structure of the integrated circuit in order to access the content of the memory. For example, such reverse-engineering techniques use a focused ion beam (FIB) or a laser.

The so-called "non-invasive" hardware attacks relate to the techniques allowing reconstituting the internal behavior of the integrated circuit, in particular the code of the internal firmware ("firmware") to deduce therefrom the data stored in the memory or to possibly exploit the vulnerabilities thereof in order to bypass the license and software restrictions. Non-invasive attacks are typically carried out when the integrated circuit is powered and in operation and use techniques such as, for example, the injection of errors or the side-channel attack.

The data of the memory should be kept secret if they form, for example, an essential element for the analysis of the operation of the integrated circuit or if they contain an encryption/decryption key, identification or authentication information, or for any other reason.

To limit the risk of leakage of information kept secret, it might be considered to conceal the data, using a data scrambling technique, for example, upon storage thereof in the memory.

Nonetheless, data scrambling is not enough since the data could become readable during the execution of programs, in particular programs of the firmware reconstituted following non-invasive attacks.

Furthermore, there are conventional means for detecting invasive or non-invasive attacks and allowing triggering a countermeasure in response. For example, the countermeasure may comprise a destruction of the integrated circuit.

There is a need to provide countermeasure techniques against invasive or non-invasive attacks, in particular in order to prevent access to the content of the memory in an extremely quick and effective manner, and without degrading either the operation or the structure of the integrated circuit.

SUMMARY

According to one aspect, a method is provided for corrupting at least one piece of data stored in at least one memory-cell of an integrated circuit, said memory-cell comprising a state transistor having a floating gate storing a charge representative of the piece of data and a control gate.

The method comprises coupling to the floating gate a capacitive structure including a first electrically-conductive body coupled to the floating gate, a second electrically-conductive body and a dielectric body between the two electrically-conductive bodies, and generating a leakage current between the first electrically-conductive body and the second electrically-conductive body through the dielectric body, the leakage current modifying the charge of the floating gate and corrupting said piece of data.

In other words, the state transistors storing the data are connected to capacitive structures whose objective is to modify the charge stored in the floating gate and to alter the information so as to make useless, for example by clearing the memory.

The capacitive structure allows obtaining a capacitive effect between, on the one side, the first electrically-conductive body which is at a floating potential and, on the other side, the second electrically-conductive body which is controllable by a voltage signal, for example a high-voltage signal.

Thus, the stored data are corrupted or lost upon invasive or non-invasive hardware attacks insofar as these attacks have been detected, for example by means for detecting invasive or non-invasive attacks. In particular, the capacitive structure allows obtaining a corruption on the data of the memory, without implementing a conventional procedure of writing in the memory (clearing/programming) which could require several clock cycles.

According to one implementation, the generation of the leakage current comprises applying a voltage on the second body greater than a threshold.

The threshold is typically defined to cause a modification of the data contained in the memory when the applied voltage is greater than the latter and allows preventing a modification of the data when this voltage is lower than or equal to the latter.

Such a threshold allows avoiding an undesirable leakage current, generated for example by a parasitic voltage in the absence of any non-invasive and invasive attack. Thus, an alteration of the charge that might occur inadvertently is prevented.

According to one implementation, the dielectric body is formed by interposing a first dielectric material between the two bodies and by covering the two bodies and the first dielectric material with a silicon nitride layer whose silicon has a weight percentage greater than or equal to 50%.

The silicon nitride layer, so-called "Si-rich", i.e., whose silicon weight percentage is greater than or equal to 50%, has advantageous characteristics allowing controlling the generation of the leakage current between the two electrically-conductive bodies so as to alter the charge and insulate the conductive bodies in the absence of invasive or non-invasive attacks thanks to the insulating properties of the silicon nitride layer and first dielectric material. Furthermore, the leakage current generated by such a silicon nitride layer has a more advantageous intensity profile than that of a leakage current that would have been generated by a non "Si-rich" silicon nitride layer.

The presence of a "Si-rich" silicon nitride layer allows obtaining a significant leakage current, i.e., in the range of one hundredth nano-ampere, for typical voltage ranges of the integrated circuit, in particular voltages in the range of 8 V for example, in contrast with a conventional silicon nitride layer producing the same leakage current but for much higher voltages, for example in the range of 45 V.

Typically, the integrated circuit can neither generate, nor withstand voltages of that order of magnitude.

According to one implementation, said generation of the leakage current is performed in response to an invasive or non-invasive attack of the integrated circuit.

The second electrically-conductive body of the capacitive structures is perfectly suited to be electrically connected to other circuits, such as circuits for detecting invasive or non-invasive hardware attacks capable of triggering the generation of the leakage current between the electrically-conductive bodies.

According to another aspect, an integrated circuit is provided comprising: at least one memory-cell, said memory-cell being configured to store a piece of data and comprising a state transistor having a floating gate configured to store a charge representative of said piece of data and a control gate, a capacitive structure including a first electrically-conductive body coupled to the floating gate, a second electrically-conductive body and a dielectric body between the two electrically-conductive bodies, and generation circuit configured to generate a leakage current between the first electrically-conductive body and the second electrically-conductive body through the dielectric body, the leakage current being capable of modifying the charge of the floating gate and corrupting said piece of data.

According to one embodiment, the generation circuit comprises a voltage generator configured to apply a voltage on the second body greater than a threshold.

According to one embodiment, the dielectric body comprises a first dielectric material interposed between the two bodies and a silicon nitride layer whose silicon has a weight percentage greater than or equal to 50%, covering the two bodies and the first dielectric material.

According to one embodiment, the first electrically-conductive body comprises a first metallic track extending in a metal level, and the second electrically-conductive body comprises a second metallic track running along the first metallic track in the same metal level.

According to one embodiment, the integrated circuit comprises several state transistors of several memory-cells and several respective capacitive structures, the capacitive structures being located in different metal levels from one capacitive structure to another.

According to one embodiment, the integrated circuit comprises a detection circuit capable of detecting an invasive or non-invasive attack of the integrated circuit and of activating the generation circuit in response to such an attack.

According to one embodiment, the memory cell further comprises an access transistor including a vertical gate buried in a semiconductor substrate, a source region deeply buried in the substrate and a drain region common to a source region of the state transistor.

According to one embodiment, the integrated circuit further includes a general-purpose non-volatile memory, said memory cell having the same structure and the same material composition as memory-cells of the general-purpose non-volatile memory.

According to another aspect, the invention further proposes a method for manufacturing an integrated circuit comprising: making at least one memory-cell comprising a state transistor having a floating gate configured to store a charge representative of said piece of data and a control gate, making at least one capacitive structure including forming a first electrically-conductive body coupled to the floating gate, a second electrically-conductive body and a dielectric body between the two electrically-conductive bodies.

The method further comprises making generation circuit configured to generate a leakage current between the first electrically-conductive body and the second electrically-conductive body through the dielectric body, the leakage current being capable of modifying the charge of the floating gate and corrupting said piece of data.

According to one implementation, the formation of the dielectric body comprises forming a first dielectric material interposed between the two bodies and forming a silicon nitride layer whose silicon has a weight percentage greater than or equal to 50%, covering the two bodies and the first dielectric material.

According to one implementation, the formation of the first electrically-conductive body comprises forming a first metallic track extending in a metal level, and the formation of the second electrically-conductive body comprises forming a second metallic track running along the first metallic track in the same metal level.

According to one implementation, the method comprises forming several state transistors of several memory-cells and forming several respective capacitive structures, the capacitive structures being located in different metal levels from one capacitive structure to another.

According to one implementation, making of the memory-cell further comprises forming an access transistor having a vertical gate buried in a semiconductor substrate of the memory-cell, a source region deeply buried in the substrate and a drain region common to a source region of the state transistor.

According to one implementation, the method further comprises manufacturing a general-purpose non-volatile memory, wherein said making of said memory-cell is implemented by the same steps as steps of the manufacture of memory-cells of the general-purpose non-volatile memory.

BRIEF DESCRIPTION OF THE DRAWINGS

Other advantages and features of the invention will appear upon examining the detailed description of non-limiting embodiments and implementations, and from the appended drawings, wherein.

DETAILED DESCRIPTION

Figure 1A:
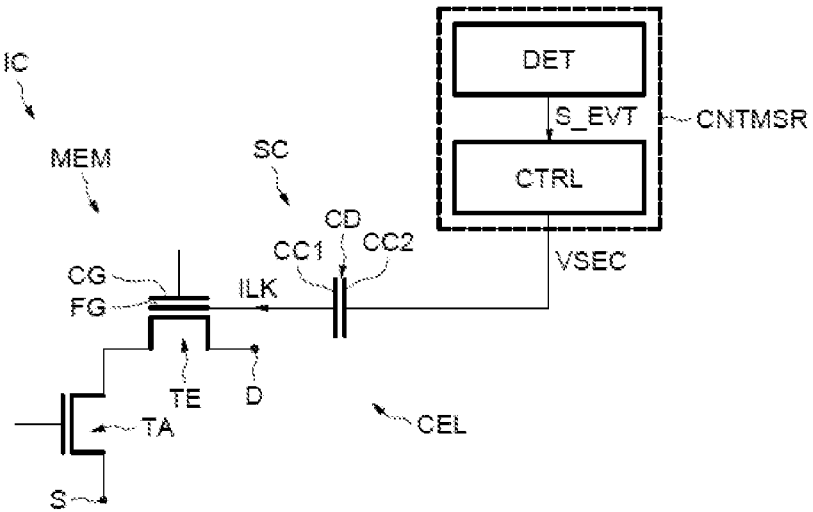
FIG. 1A shows an electrical diagram of a memory cell of a memory of an integrated circuit.

FIG. 1A shows an electrical diagram of a memory cell MEM of a memory of an integrated circuit IC.

Figure 1B:
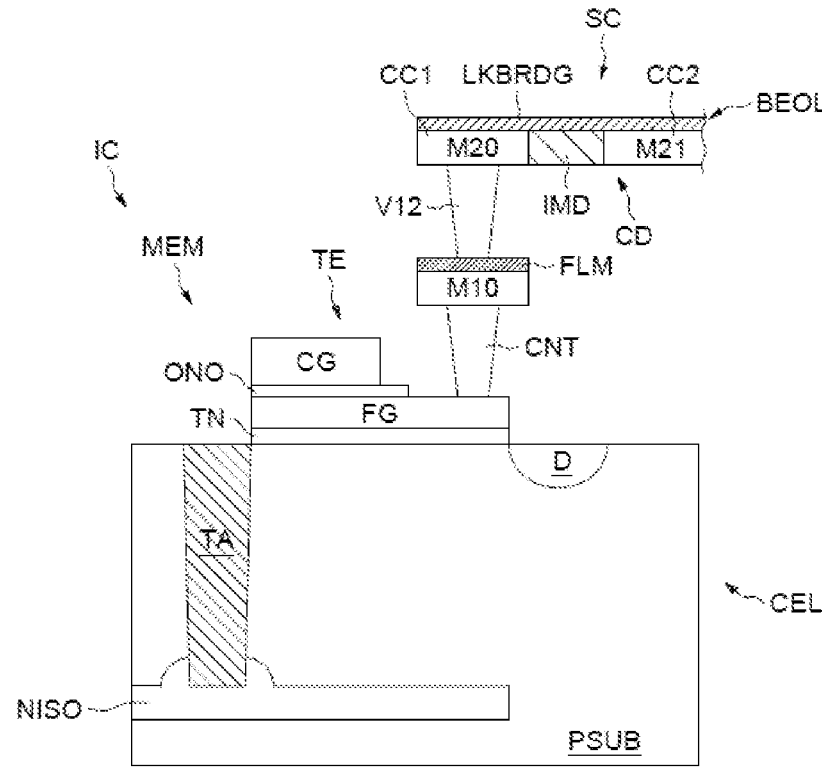
FIG. 1B shows a sectional view of the memory cell.

FIG. 1B shows a sectional view of the same memory cell MEM manufactured in and over a semiconductor substrate PSUB of the integrated circuit IC.

The memory cell MEM includes an access transistor TA, allowing selecting the memory cell MEM amongst others in the non-volatile memory, according to an example of configuration of a buried transistor with a vertical gate.

The gate of the access transistor TA is formed by a conductive material, for example of polycrystalline silicon, filling an open trench in the substrate PSUB whose walls have been covered with a gate oxide. A buried semiconductor region NISO deeply buried in the substrate PSUB at the bottom of the trench forms a source region S of the access transistor TA. The access transistor TA further includes a drain region common, i.e., identical, to the source region of the state transistor TE.

The memory cell MEM includes a state transistor TE allowing storing a piece of data. The state transistor TE includes a floating gate FG and a control gate CG.

To write a piece of data in the state transistor TE, charges are injected by Fowler-Nordheim effect through a tunnel dielectric TN, between the floating gate FG and a drain region D.

The control gate CG is electrically insulated from the floating gate FG by a dielectric region of the silicon oxide-nitride-oxide ONO type. The control gate CG allows generating the electric fields for the Fowler-Nordheim effect, and to read the stored data. Reading is based on a measurement of the threshold voltage on the control gate CG of the state transistor TE, which is parametrized by the charge of the floating gate FG.

Thus, the charge of the floating gate FG in each state transistor TE is representative of a respective piece of data, "0" or "1".

The data stored in the state transistors TE are written in order to be read to implement a function of the integrated circuit IC. The state transistors TE may store data having to be kept secret. For example, data that have to be kept secret may be the data that encode start-up instructions of the integrated circuit, or which contain an encryption/decryption key.

The integrated circuit IC further includes a capacitive structure SC comprising a first electrically-conductive body CC1 electrically coupled to the floating gate FG of the state transistor TE, a dielectric body CD, and a second electrically-conductive body CC2. The dielectric body CD comprises a first dielectric material IMD interposed between the first body CC1 and the second body CC2. The first dielectric material IMD is configured with a low dielectric constant, generally with a porous structure, and for example made of silicon oxide.

As shown in FIG. 1B, the capacitive structure SC is formed from a first metallic track M20 and a second metallic track M21 located in the same metal level of the interconnection portion BEOL of the integrated circuit (commonly referred to by the term "Back End Of Line").

The floating gate FG of the state transistor TE is coupled to the first electrically-conductive body CC1 through a contact CNT, connecting the elements of the front face of the substrate PSUB with a metallic track M10 of the first metal level of the BEOL, and through vias V12 connecting the metallic track M10 of the first metal level (M1) to the first metallic track M20 of the second metal level. Although shown for simplification in the second metal level (M2), the capacitive structure SC may advantageously be formed in higher metal levels, without limitation, for example the fifth, the sixth or the seventh metal level.

The dielectric body CD also comprises a silicon nitride (SiN) layer LKBRDG covering the two bodies CC1 and CC2 and the first dielectric material IMD. Advantageously, the silicon nitride layer LKBRDG has a silicon weight percentage greater than or equal to 50%.

Alternatively, the dielectric body CD comprises a silicon carbonitride layer (SiCN) for the layer LKBRDG. Advantageously, the silicon carbonitride layer LKBRDG has a silicon weight percentage greater than or equal to 40%. Next, reference will be made only to a silicon nitride layer LKBRDG without excluding the use of silicon carbonitride whose silicon weight percentage and electrical characteristics are substantially the same.

The silicon nitride layer LKBRDG forms a so-called "Si-rich" dielectric film which differs from a conventional dielectric film made of silicon nitride with a stoichiometry $Si_3N_4$ usually provided for between a metal level n and a metal level n+1 to protect metallic tracks of the same level. Indeed, a "Si-rich" dielectric film whose silicon weight percentage is greater than or equal to 50% allows generating a leakage current ILK between the first body CC1 and the second body CC2 whose intensity is high enough, for example 1 pA, to enable an alteration of the charge in the floating gate FG when a relatively low voltage VSEC, for example 7.5 V, is applied on the second electrically-conductive body CC2. Furthermore, the intensity of the leakage current ILK in such a "Si-rich" dielectric film increases more quickly according to the voltage VSEC on the second electrically-conductive body CC2, than that of the leakage current that would have been generated by a conventional dielectric film.

The leakage current ILK generated by the silicon nitride layer LKBRDG having this silicon proportion has an intensity greater than or equal to a hundredth nano-ampere (0.01 nA) when the voltage VSEC applied on the second electrically-conductive body CC2 reaches a threshold VLK equal to 7.5 V. Similarly, a leakage current which would have been generated by the "Si-rich" silicon carbonitride layer, whose silicon proportion is slightly lower than that of the "Si-rich" silicon nitride, would have the same order of magnitude as the leakage current generated by the silicon nitride layer for the same voltage value VSEC.

For example, a conventional dielectric film made of silicon nitride $Si_3N_4$ generates a leakage current with the same intensity value only for voltages greater than at least 30 V. Typically, the integrated circuit IC can neither generate, nor withstand voltages of that order of magnitude.

The threshold VLK represents the voltage necessary to enable a generation of a leakage current ILK capable of corrupting the data of the memory-cell MEM and may vary according to the silicon weight percentage of the silicon nitride layer LKBRDG. A person skilled in the art should be able to adjust the silicon weight percentage to obtain the desired threshold value VLK.

A leakage current ILK having an intensity greater than or equal to a hundredth nano-ampere (0.01 nA) allows modifying the charge of the floating gate FG in order to corrupt the data contained in the memory-cell and to make them useless without damaging the memory-cell MEM or the capacitive structure SC. For example, it is possible to generate a leakage current ILK allowing clearing the data of the memory-cell MEM.

Thus, the silicon nitride layer LKBRDG profits from imperfections in terms of electrical insulation making the layer LKBRDG more permissive to the passage of the leakage current ILK for voltage values likely to be generated by the integrated circuit IC without any risk of damage, for example upon an invasive or non-invasive attack.

In this respect, the integrated circuit IC includes a generation circuit CNTMSR comprising a detection circuit DET capable of detecting an invasive or non-invasive attack and a voltage generator CTRL electrically coupled to the second electrically-conductive body CC2.

In the case of a non-invasive attack, the detection circuit DET may, for example, be a "trusted" master device such as a trusted domain of a processor, capable of detecting an illegal intrusion in the memory or a violation of a "firewall" type protection system and of making the decision to launch a countermeasure.

In the case of an invasive attack, the detection circuit DET may be a circuit known to a person skilled in the art, for example a circuit capable of detecting a variation of a resistive value in the substrate PSUB of the integrated circuit IC resulting from a thinning of the substrate PSUB.

The voltage generator CTRL is typically a voltage regulator or a step-up converter, or else a charge pump with a conventional design capable of generating voltages greater than 7.5 V, for example a voltage of 9 V (i.e., non-zero or not ground voltages), from the power supply of the integrated circuit IC.

The generation circuit CNTMSR are activated when an attack is detected by the detection circuit DET which may be configured, according to a possible scenario, to transmit for example a detection signal S_EVT to the voltage generator CTRL. The voltage generator CTRL is configured to generate, upon reception of the detection signal S_EVT according to this scenario, a voltage VSEC on the second electrically-conductive body CC2 greater than the threshold VLK, which is, to recall, equal to about 8 V.

In the absence of a detection of an invasive or non-invasive attack, the voltage generator CTRL generates a voltage VSEC lower than the threshold VLK in order to avoid an undesirable leakage current and an alteration of the charge likely to occur inadvertently.

Thus, the generation circuit CNTMSR allows cooperating with the capacitive structure SC so as to implement a countermeasure intended to modify, and possibly clear, the information of the memory-cell MEM in the event of an invasive or non-invasive attack.

For example, the integrated circuit IC includes a general-purpose non-volatile memory, i.e., for storing data that are not necessarily critical, the memory cells of the general-purpose memory not benefiting from the countermeasure mechanism obtained in particular by the capacitive structure SC coupled to the floating gate, as described before.

Advantageously, the memory cell MEM is made co-integrated with the general-purpose non-volatile memory, i.e., made through the same manufacturing steps, so that the memory cell MEM has the same structure and the same material composition as the memory-cells of the general-purpose non-volatile memory.

Figure 2:
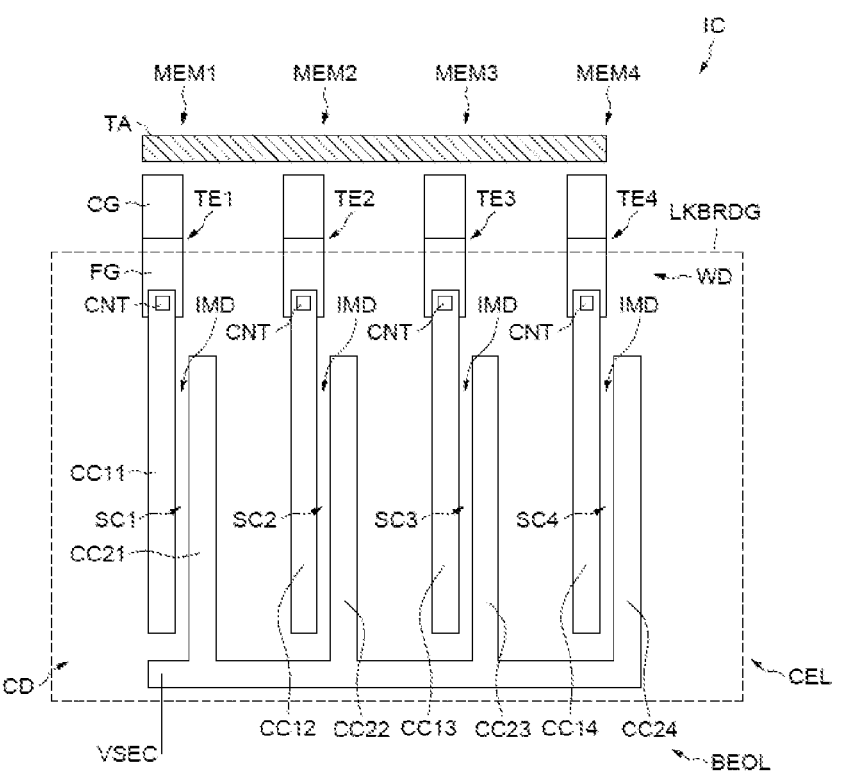
FIG. 2 shows a top view of the integrated circuit.

FIG. 2 shows a top view of the integrated circuit IC.

The integrated circuit IC conventionally comprises several memory cells MEM1, MEM2, MEM3, MEM4 as described with reference to FIGS. 1A and 1B, for example grouped together by memory word WD.

Thus, each of the memory cells MEM1-MEM4 includes a state transistor TE1-TE4, and shares within a memory word WD the structure of the access transistor TA.

The integrated circuit IC includes (at least) one capacitive structure SC1-SC4 per state transistor TE1-TE4, each in a metal level. Thus, the capacitive structures SC1-SC4 may be located in different metal levels, the metal level possibly varying from one capacitive structure to another.

In each capacitive structure SC1-SC4, the first electrically-conductive body CC11-CC14 and the second electrically-conductive body CC21-CC24 are located in the same metal level of the interconnection portion BEOL of the integrated circuit IC.

The second electrically-conductive body CC21-CC24 has a shape matching with at least one portion of the boundary of the shape of the first electrically-conductive body CC11-CC14.

In the shown example, each first electrically-conductive body CC11-CC14 is formed by a first metallic track extending in a direction of the plane of the metal level. The second electrically-conductive bodies CC21-CC24 are formed by second metallic tracks respectively running along each first metallic track in the same metal level.

Moreover, the second electrically-conductive bodies CC21-CC24 may be coupled to the same voltage generator CTRL described before with reference to FIG. 1A so that the data stored by each state transistor TE of the memory-word WD are modified or deleted simultaneously in the event of an attack.

FIGS. 3 to 6 illustrate steps of a method for manufacturing the integrated circuit IC as described before with reference to FIGS. 1A and 1B.

Figure 3:
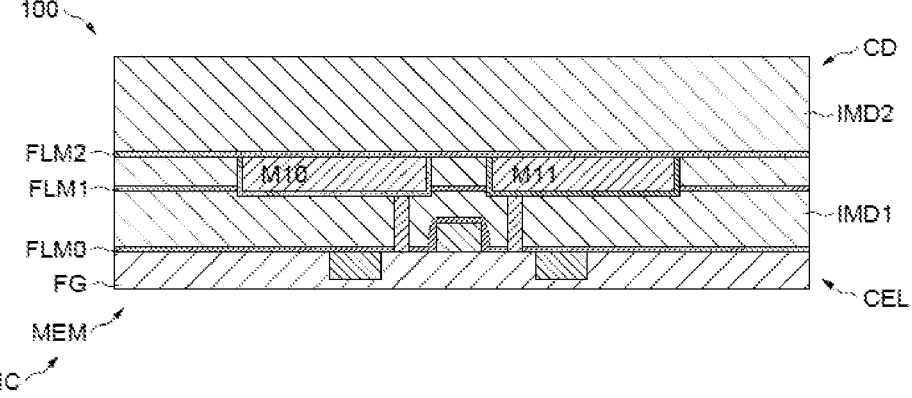
FIGS. 3 to 6 illustrate steps of a method for manufacturing the integrated circuit.

FIG. 3 illustrates a step 100 of forming a dielectric material layer IMD2 of a metal level n+1 of the interconnection portion BEOL of the integrated circuit IC.

At this level, the state transistor TE as well as the layers of materials of a first metal level n are already formed. The formation of the layers of the first metal level n typically comprises etching a first dielectric material layer IMD1 up to a first dielectric film FLM1, forming metallic tracks M10 and M11 by depositing a metal, for example copper (Cu), in the etched spaces of this first dielectric material layer IMD1 followed by forming a second dielectric film FLM2 covering the metallic tracks M10 and M11 and the first dielectric material layer IMD1.

The first and second dielectric films FLM1 and FLM2 are layers of common silicon nitride, for example with a $Si_3N_4$ stoichiometry.

During step 100, a second dielectric material layer IMD2 is formed over the second dielectric film FLM2. The dielectric materials IMD1 and IMD2 may be same as the dielectric material IMD described before with reference to FIGS. 1A to 2.

Figure 4:
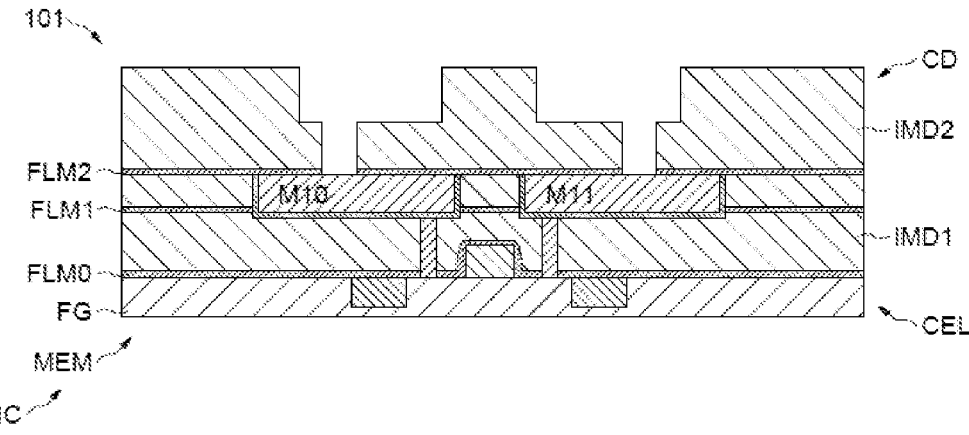

FIG. 4 illustrates a step 101 of etching trenches dedicated to the formation of the first conductive body CC1 and of the second conductive body CC2.

In particular, the trenches may be formed by etching the second dielectric material layer IMD2 and the second dielectric film FLM2 so as to uncover at least partially the surface of the metallic tracks M10 and M11.

Figure 5:
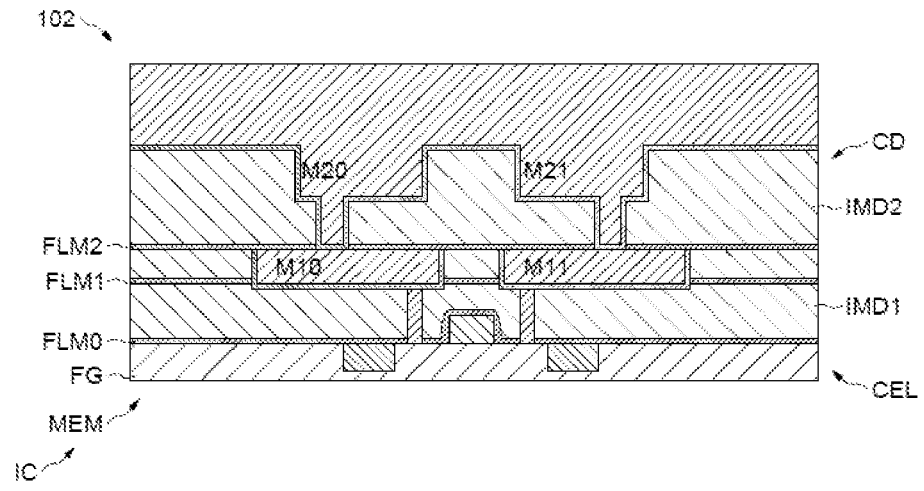

FIG. 5 illustrates a step 102 of forming the first electrically-conductive body CC1 and the second electrically-conductive body CC2. In particular, step 102 may comprise forming a first metallic track M20 and a second metallic track M21 by depositing a metal, for example copper (Cu), in the trenches followed by a chemical-mechanical planarization (CMP). Thus, the first electrically-conductive body CC1 comprises the first metallic track M20 extending in the metal level n+1 and the second electrically-conductive body CC2 comprises the second metallic track M21 of the same metal level n+1.

Figure 6:
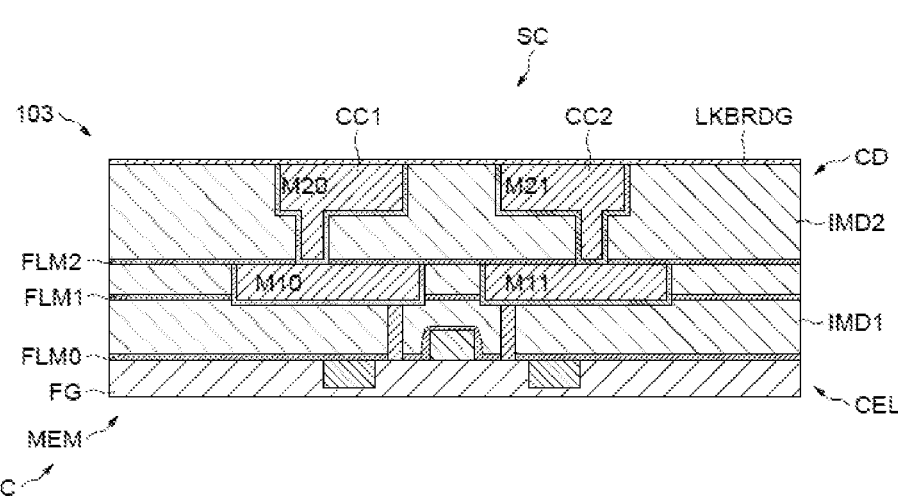

FIG. 6 illustrates a step 103 of forming the silicon nitride structure LKBRDG. The silicon nitride layer LKBRDG covers the first electrically-conductive body CC1 and the second electrically-conductive body CC2 as well as the second dielectric material layer IMD2 so as to form a capacitive structure SC. The second electrically-conductive body CC2 of such a capacitive structure SC, obtained at the end of step 103, may be coupled to the generation circuit CNTMSR described before with reference to FIGS. 1A to 3. In particular, the voltage generator CTRL of the generation circuit CNTMSR is configured to generate a voltage on the second electrically-conductive body CC2 so that the nitride layer LKBRDG generates a leakage current ILK between the first body CC1 and the second body CC2.

Indeed, the silicon nitride layer LKBRDG forms a so-called "Si-rich" dielectric film which differs from the dielectric films FLM1 and FLM2 by its silicon proportion which is greater than or equal to 50% and allows generating a leakage current ILK between the first body CC1 and the second body CC2 whose intensity is high enough, for example 1 pA, to enable an alteration of the charge in the floating gate FG when a relatively low voltage, for example 7.5 V, is applied on the second electrically-conductive body CC2. Furthermore, the intensity of the leakage current ILK in such a "Si-rich" dielectric film increases more quickly according to the voltage VSEC on the second electrically-conductive body CC2, than that of the leakage current that would have been generated by a conventional dielectric film.

Alternatively, step 103 is a step of forming a silicon carbonitride (SiCN) layer. The silicon carbonitride layer LKBRDG is formed in a similar way as that of the previously-described silicon nitride layer and advantageously has a silicon weight percentage greater than or equal to 40%.

The leakage current ILK generated by the "Si-rich" silicon nitride layer LKBRDG has an intensity greater than or equal to a hundredth nano-ampere (0.01 nA) when the voltage applied on the second electrically-conductive body CC2 reaches a threshold VLK equal to 7.5 V.

The threshold VLK represents the voltage necessary to enable a generation of a leakage current ILK capable of corrupting the data of the memory-cell MEM and may vary according to the silicon weight percentage of the silicon nitride layer LKBRDG. A person skilled in the art should be able to adapt the silicon weight percentage to obtain the desired threshold value VLK.

The invention claimed is:

1. A method for corrupting a piece of data stored in a memory-cell of an integrated circuit, said memory-cell comprising a state transistor having a floating gate storing a charge representative of the piece of data and a control gate, the method comprising:

coupling a capacitive structure to the floating gate, the capacitive structure including a first electrically-conductive body coupled to the floating gate, a second electrically-conductive body and a dielectric body between the second electrically-conductive body and the first electrically-conductive body;

detecting an invasive or non-invasive attack of the integrated circuit using a detection circuit;

generating a non-zero voltage in response to the detecting;

applying the non-zero voltage to the second electrically-conductive body of the capacitive structure;

generating a leakage current by the capacitive structure in response to the non-zero voltage applied to the second electrically-conductive body, wherein the leakage current passes through the dielectric body between the second electrically-conductive body and the first electrically-conductive body; and applying said leakage current to the floating gate to modify the charge of the floating gate and corrupt said piece of data.

2. The method according to claim 1, wherein the non-zero voltage applied to the second electrically-conductive body is greater than a threshold.

3. The method according to claim 2, wherein the threshold is greater than a programming voltage of the memory-cell.

4. The method according to claim 1, wherein the dielectric body is formed by a first dielectric material interposed between the first and second electrically-conductive bodies, wherein the first and second electrically-conductive bodies and the first dielectric material are covered with a nitride layer.

5. The method according to claim 4, wherein the nitride layer is made of silicon nitride material having a silicon weight percentage greater than or equal to 50%.

6. The method according to claim 4, wherein the nitride layer is made of silicon carbonitride material having a silicon weight percentage greater than or equal to 40%.

7. An integrated circuit, comprising:

a memory-cell configured to store a piece of data and comprising a state transistor having a floating gate configured to store a charge representative of said piece of data and a control gate;

a capacitive structure including a first electrically-conductive body coupled to the floating gate, a second electrically-conductive body and a dielectric body between the first electrically-conductive body and the second electrically-conductive body; and a generation circuit configured to detect an invasive or non-invasive attack of the integrated circuit and generate, in response to the detection, a non-zero voltage that is applied to the second electrically-conductive body to generate a leakage current between the first electrically-conductive body and the second electrically-conductive body through the dielectric body, said leakage current being applied to the floating gate to modify the charge of the floating gate and corrupt said piece of data.

8. The integrated circuit according to claim 7, wherein the non-zero voltage applied to the second electrically-conductive body is greater than a threshold.

9. The integrated circuit according to claim 8, wherein the threshold is greater than a programming voltage of the memory-cell.

10. The integrated circuit according to claim 7, wherein the dielectric body comprises a first dielectric material interposed between the first and second electrically-conductive bodies and a nitride layer which covers the first and second electrically-conductive bodies and the first dielectric material.

11. The integrated circuit according to claim 10, wherein the nitride layer is made of silicon nitride material having a silicon weight percentage greater than or equal to 50%.

12. The integrated circuit according to claim 10, wherein the nitride layer is made of silicon carbonitride material having a silicon weight percentage greater than or equal to 40%.

13. The integrated circuit according to claim 7, wherein the first electrically-conductive body comprises a first metallic track extending in a metal level, and the second electrically-conductive body comprises a second metallic track running along the first metallic track in the same metal level.

14. The integrated circuit according to claim 7, comprising plural memory cells and plural capacitive structures, and wherein the plural capacitive structures are located in a same metal level.

15. The integrated circuit according to claim 7, comprising plural memory cells and plural capacitive structures, and wherein the plural capacitive structures are located in different metal levels from one capacitive structure to another.

16. The integrated circuit according to claim 7, wherein the memory cell further comprises an access transistor including a vertical gate buried in a semiconductor substrate, a source region buried in the substrate and a drain region common to a source region of the state transistor.

17. The integrated circuit according to claim 7, wherein the memory cell is one of a plurality of memory cells included in a general-purpose non-volatile memory, each memory cell of said plurality of memory cells having a same structure and a same material composition.

\* \* \* \* \*